United States Patent
Huang et al.

(10) Patent No.: US 7,122,878 B2
(45) Date of Patent: Oct. 17, 2006

(54) METHOD TO FABRICATE HIGH RELIABLE METAL CAPACITOR WITHIN COPPER BACK-END PROCESS

(75) Inventors: Chi-Feng Huang, Pingtung (TW); Chun-Hon Chen, Hsin-Chu (TW); Shy Chy Wong, Taichung (TW); Chih Hsien Lin, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 11/143,229

(22) Filed: Jun. 2, 2005

(65) Prior Publication Data
US 2005/0221575 A1 Oct. 6, 2005

Related U.S. Application Data

(62) Division of application No. 10/307,617, filed on Dec. 2, 2002, now Pat. No. 6,916,722.

(51) Int. Cl.
*H01L 29/00* (2006.01)
(52) U.S. Cl. ............... 257/532; 257/640; 257/649; 257/E23.144; 257/E23.161; 257/E23.163
(58) Field of Classification Search ............ 257/296, 257/306, 532, 640, 649, E23.144, E23.161, 257/E23.163
See application file for complete search history.

(56) References Cited

U.S. PATENT DOCUMENTS

| 5,206,788 A | 4/1993 | Larson et al. ............... 361/313 |
| 5,583,068 A | 12/1996 | Jones, Jr. et al. ............. 438/3 |
| 5,654,222 A | 8/1997 | Sandhu et al. ............... 438/3 |
| 5,770,517 A | 6/1998 | Gardner et al. ............. 438/627 |
| 5,879,957 A | 3/1999 | Joo ............................... 438/3 |
| 5,903,493 A | 5/1999 | Lee ............................ 365/149 |
| 6,025,223 A | 2/2000 | Park ........................... 438/240 |
| 6,069,051 A * | 5/2000 | Nguyen et al. ............. 438/396 |
| 6,144,051 A * | 11/2000 | Nishimura et al. ......... 257/277 |
| 6,180,976 B1 | 1/2001 | Roy ............................ 257/306 |
| 6,274,435 B1 | 8/2001 | Chen .......................... 438/267 |
| 6,300,682 B1 | 10/2001 | Chen .......................... 257/758 |
| 6,323,099 B1 | 11/2001 | Long et al. ................. 438/396 |

(Continued)

OTHER PUBLICATIONS

Wolf, Ph.D., Stanley, Richard N. Tauber, Ph.D., "Chemical Vapor Deposition of Amorphous and Polycrystalline Films," Silicon Processing for the VLSI Era—vol. 1: Process Technology, Lattice Press, 1986, pp. 183-184.

(Continued)

*Primary Examiner*—Mary Wilczewski
*Assistant Examiner*—Toniae M. Thomas
(74) *Attorney, Agent, or Firm*—Thomas, Kayden, Horstemeyer & Risley

(57) ABSTRACT

A new method is provided for the creation of a high-reliability metal capacitor as part of back-end processing. A first layer of metal interconnect is created, ac contact point is provided in the surface of the first layer of interconnect aligned with which a capacitor is to be created. A copper interconnect is formed overlying the contact point using TaN for the bottom plate, a high dielectric-constant dielectric material capacitor and using TaN for the top plate. The deposited layers are patterned and etched, a spacer layer is formed over sidewalls of the capacitor to prevent capacitor sidewall leakage. Top interconnect metal is then formed by first depositing a layer of etch stop material for further interconnection of the capacitor and the semiconductor devices provided in the underlying substrate.

14 Claims, 4 Drawing Sheets

U.S. PATENT DOCUMENTS

| | | | |
|---|---|---|---|
| 6,329,234 B1 | 12/2001 | Ma et al. | 438/210 |
| 6,338,999 B1 | 1/2002 | Hsue et al. | 438/253 |
| 6,344,964 B1 | 2/2002 | Adler | 361/306.3 |
| 6,429,089 B1 | 8/2002 | Matsuki | 438/396 |
| 6,452,779 B1 | 9/2002 | Adler et al. | 361/306.3 |
| 6,459,562 B1* | 10/2002 | KarRoy et al. | 361/312 |
| 6,461,914 B1 | 10/2002 | Roberts et al. | 438/253 |
| 6,504,203 B1 | 1/2003 | Gambino et al. | 257/303 |
| 6,509,601 B1 | 1/2003 | Lee et al. | 257/310 |
| 6,576,526 B1 | 6/2003 | Kai et al. | 438/393 |
| 6,583,491 B1* | 6/2003 | Huang et al. | 257/532 |
| 6,635,498 B1 | 10/2003 | Summerfelt et al. | 438/3 |
| 6,734,079 B1* | 5/2004 | Huang et al. | 438/396 |
| 6,803,641 B1* | 10/2004 | Papa Rao et al. | 257/532 |
| 6,853,082 B1* | 2/2005 | Chen et al. | 257/762 |
| 6,876,028 B1* | 4/2005 | Coolbaugh et al. | 257/306 |
| 2001/0013614 A1 | 8/2001 | Joshi et al. | 257/295 |
| 2001/0019141 A1 | 9/2001 | Takahashi | 257/295 |
| 2002/0127792 A1 | 9/2002 | Yoshitomi et al. | 438/239 |
| 2002/0168831 A1 | 11/2002 | Miyasaka et al. | 438/396 |
| 2003/0008467 A1* | 1/2003 | Kai et al. | 438/393 |
| 2003/0042522 A1 | 3/2003 | Mikawa et al. | 257/298 |
| 2003/0211731 A1* | 11/2003 | Kai et al. | 438/638 |
| 2003/0232481 A1 | 12/2003 | Huang et al. | 438/396 |
| 2004/0087098 A1* | 5/2004 | Ng et al. | 438/381 |
| 2004/0155277 A1* | 8/2004 | Koh | 257/303 |
| 2004/0201057 A1* | 10/2004 | Lien et al. | 257/306 |
| 2005/0063138 A1* | 3/2005 | Rost et al. | 361/306.3 |
| 2005/0121744 A1* | 6/2005 | Chang et al. | 257/532 |
| 2005/0130369 A1* | 6/2005 | Kim et al. | 438/250 |
| 2005/0170583 A1* | 8/2005 | Park | 438/253 |
| 2005/0189577 A1* | 9/2005 | Wang | 257/303 |
| 2006/0071262 A1* | 4/2006 | Wang | 257/303 |

OTHER PUBLICATIONS

Wolf, Ph.D., Stanley, Richard N. Tauber, Ph.D., "Chemical Vapor Deposition of Amorphous and Polycrystalline Films," Silicon Processing for the VLSI Era—vol. 1: Process Technology, Lattice Press, 1986, pp. 187-188.

\* cited by examiner

METHOD TO FABRICATE HIGH RELIABLE METAL CAPACITOR WITHIN COPPER BACK-END PROCESS

CROSS-REFERENCE TO RELATED APPLICATION

This application is a divisional of U.S. patent application Ser. No. 10/307,617, filed Dec. 2, 2002, issued as U.S. Pat. No. 6,916,722.

BACKGROUND OF THE INVENTION

1. Field of the Invention

The invention relates to the fabrication of integrated circuit devices, and more particularly, to a method for the formation of a capacitor during back-end processing whereby specifically are addressed concerns of capacitor breakdown and capacitor leakage.

2. Description of the Prior Art

For many semiconductor devices, devices that are created for the purpose of operating in mixed mode of both logic and RF high frequency processing, high quality capacitors and inductors form an integral part of the created device. Digital and analog methods of signal processing may in this manner reside side by side in the same semiconductor device or package.

It is therefore not uncommon to see a mixture of electrical components and functions, comprising semiconductor devices, resistors and capacitors. The majority of semiconductor components consists of transistors, gate electrodes and a variety of switching components for the performance of logic processing functions. Capacitors may form a basic component of analog circuits in for instance switched capacitor filters. Capacitors are further widely applied in digital applications such as the storage node for Dynamic Random Access Memory (DRAM) circuits.

Requirements for the creation of high-frequency components such as capacitors and inductors include such aspects as low series resistance, low losses incurred in the component, high Q factor for a created capacitor, low RC time constants and the like. It is in addition desirable, for reasons of processing efficiencies and processing costs, to be able to create any reactive component such as a capacitor and an inductor as part of and integratable with the processing of a conventional semiconductor device manufacturing foundry.

One of the more common methods of creating a capacitor is the creation of a Metal-Insulator-Metal (MIM) capacitor, which finds frequent application in the creation of high-performance MOS devices that for instance are part of Random Access Memory (RAM) devices. Such a capacitor can have a sandwich or parallel plate structure. The bottom plate, of metal, is separated from the top plate, equally of metal, by a thin layer of capacitor dielectric. Both the top and the bottom plate can, for more modern capacitor fabrication processes, be made using a sequence of copper (for the bottom plate) followed by silicon nitride (for the capacitive dielectric) followed by copper (for the top plate of the capacitor). Copper however in this processing sequence is prone to the occurrence of surface irregularities such as copper hillocks, which leads to capacitor initial breakdown. These copper hillocks are further the cause of an unacceptably high level of capacitor leakage current, especially where silicon nitride is used as a material for the capacitor dielectric.

The conventional process of creating a capacitor in combination with the creation of a CMOS device is a relatively complex and therefore expensive process. This will further emphasize that the process of the invention, whereby a Metal-Insulator-Metal (MIM) capacitor is created that can be applied for mixed-mode applications, is a relatively simple and therefore cost effective method of creating a capacitor.

U.S. Pat. No. 6,274,435 B1 (Chen) and U.S. Pat. No. 6,300,682 B2 (Chen) shows a MIM capacitor and backend process.

U.S. Pat. No. 6,323,099 B2 (Long et al.) shows a Cu dual damascene capacitor.

U.S. Pat. No. 6,338,999 B1 (Hsue et al.) shows a TaN and Cu metal dual damascene capacitor process.

U.S. Pat. No. 6,329,234 B1 (Ma et al.) shows a Cu compatible CMOS MIM cap structure.

SUMMARY OF THE INVENTION

A principle objective of the invention is to provide a method of creating a MIM capacitor having high voltage breakdown and low leakage current performance characteristics.

In accordance with the objectives of the invention a new method is provided for the creation of a high-reliability metal capacitor as part of back-end processing. Copper interconnects to a capacitor are formed, a first layer for the bottom plate for the metal capacitor is deposited using material of a copper diffusion barrier such as TaN, TiN or Ta. The dielectric layer for the metal capacitor is deposited, a second layer for the top plate for the metal capacitor is deposited using a copper diffusion barrier material such as TaN, TiN or Ta. The deposited layers are patterned and etched, a spacer layer is formed to prevent capacitor sidewall leakage. Top interconnect metal is then formed for further interconnection of the capacitor.

DESCRIPTION OF THE PREFERRED EMBODIMENTS

Where the invention uses conventional methods of deposition and the patterning and etching of deposited layers of semiconductor material, these conventional methods will not be specifically highlighted since such an explanation does not contribute to a further understanding of the invention.

Figure 1:
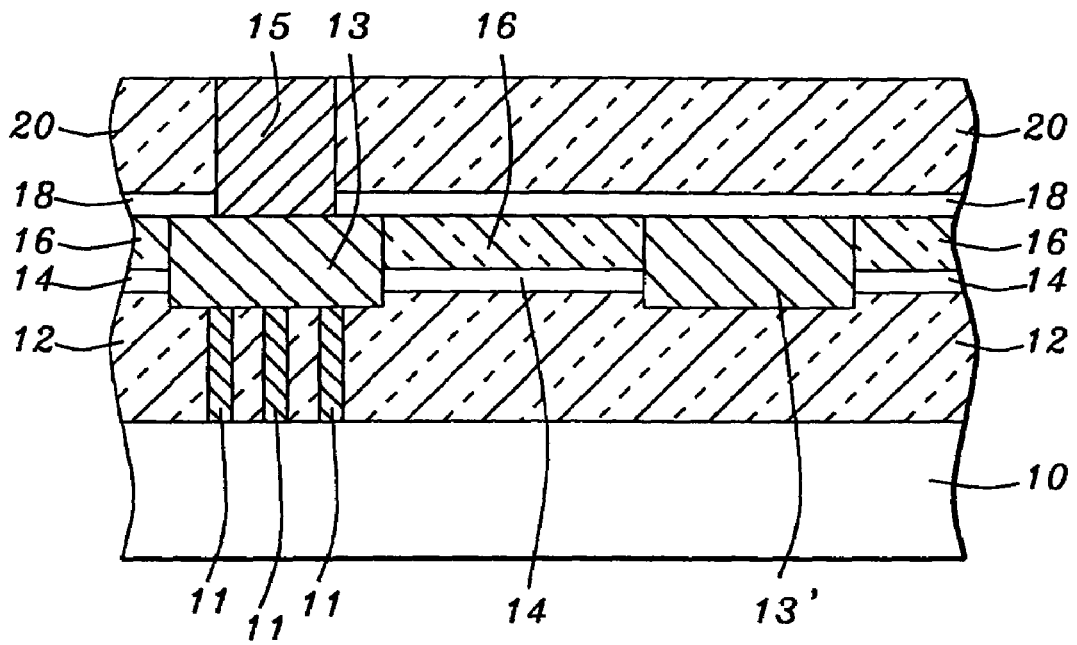
FIG. 1 is a cross-section of a semiconductor surface over the surface of which a first layer of interconnect metal has been formed, a copper interconnect has been created overlying the first layers of interconnect in a location aligned with the location over which a MIM capacitor is to be created and contacting the bottom plate of the to be created MIM capacitor.

Referring now specifically to the cross section that is shown in FIG. 1, highlighted in this cross section are the following elements:

10, a semiconductor surface, preferably the surface of a monocrystalline silicon substrate 12, a first layer of dielectric deposited over the surface of substrate 10

14, a first layer of etch stop material deposited over the surface of layer 12

16, a second layer of dielectric deposited over the surface of the first layer 14 of etch stop material 11, metal interconnects (vias) that have been created through the first layer 12 of dielectric; metal interconnects 11 preferably use copper and are created with the purpose of creating a metal capacitor aligned therewith; it is assumed (not shown) that metal interconnects 11 make contact with semiconductor devices (not shown) that have been created in or over the surface of substrate 10; conventional methods of dielectric patterning and etching are applied for the creation of openings for metal interconnects 11 through layer 12 of dielectric, after the openings have been created a layer of copper is universally deposited over the surface of layer 12 of dielectric and polished in order to removed excess copper from the surface of layer 12; copper filling or plugs 11 remain in place after completion of the removal of the excess copper from the surface of layer 12 of dielectric trench etch (not shown) is performed for the creation of trenches through layer 16 and 14 for the creation of copper interconnects 13 and 13' therein 13 and 13', copper interconnects formed through the layer 16 of dielectric and the layer 14 of etch stop material; copper plug 13 aligns with a thereover to be created metal capacitor 18, a second layer of etch stop material deposited over the surface of second layer 16 of dielectric 20, a third layer of dielectric deposited over the surface of the second layer 16 of etch stop material, and 15, a copper plug formed through the layer 20 of dielectric and the layer 18 of etch stop material, copper plug 15 aligns with a thereover to be created metal capacitor and will be connected to the bottom plate of the to be created MIM capacitor.

It must be emphasized that the layers of semiconductor material shown in cross section in FIG. 1, such as layers 12, 16, 20 of dielectric and the layers 14 and 18 of etch stop material, in addition to the patterns 11, 13 and 13' of interconnect metal, have been shown merely for purposes of example. The structures that have been shown in cross section in FIG. 1 demonstrate that layers of interconnect metal may first be created and prior to the creation of a metal capacitor over the surface thereof. The metal capacitor may or may not be aligned with and may or may not be in contact with the layers of created interconnect metal as is highlighted in the cross section of FIG. 1. The cross section that is shown in FIG. 1 therefore represents front-end processing in a processing sequence that is aimed at creating layers of interconnect metal whereby a metal capacitor is integrated within this sequence of creating interconnect metal.

In must in the cross section that is shown in FIG. 1 further be emphasized and of significant importance to the invention that copper interconnect 15 serves as the electrical interconnection to the bottom electrode of the thereover to be created MIM. If copper interconnect 15 were not provided, the layers of MIM material (layers 22, 24 and 26, FIG. 2) would be deposited directly over the surface of layers 13 and 13'. During etching of the layers of MIM material the surface of layer 13' would be exposed and would be damaged by the etch of the layers of MIM material. The provision of copper plug 15 allows the presence of layer 20 of dielectric overlying copper interconnect 13' and providing protection to layer 13' is a consequence.

Figure 2:
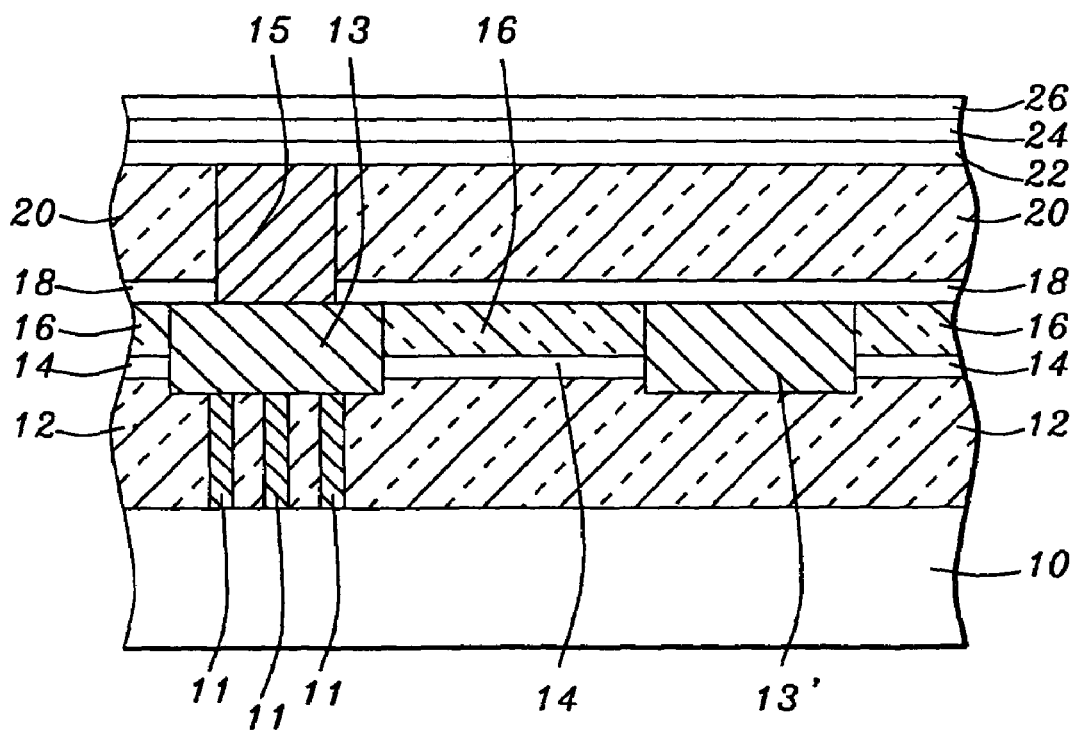
FIG. 2 is a cross-section after the deposition of three layers of semiconductor material for the creation of a metal capacitor.

The invention continues with the deposition of layers 22, 24 and 26, shown in cross section in FIG. 2, for the creation of a metal capacitor over the surface of layer 20 of dielectric.

Layer 22 preferably comprises material that forms a copper diffusion barrier such as TaN, TiN or Ta deposited to a thickness as required for the creation of a bottom plate of a metal capacitor. Layer 24 comprises a high dielectric constant (k) capacitor dielectric material such as oxide-nitride-oxide (ONO), silicon dioxide ($SiO_2$), silicon nitride ($Si_3N_4$), and other high dielectric constant material such as tantalum pentoxide ($TaO_5$).

Layer 26 preferably comprises a material that forms a copper diffusion barrier such as TaN, TiN or Ta, deposited to a thickness as required for the creation of a top plate of a metal capacitor.

The use of a copper diffusion barrier material, such as TaN, TiN or Ta, for the creation of layers 22 and 26, which are used for the creation of the bottom and top plate of a MIM capacitor, replacing conventional copper for this purpose, is one of the key aspects of the invention.

Figure 3:
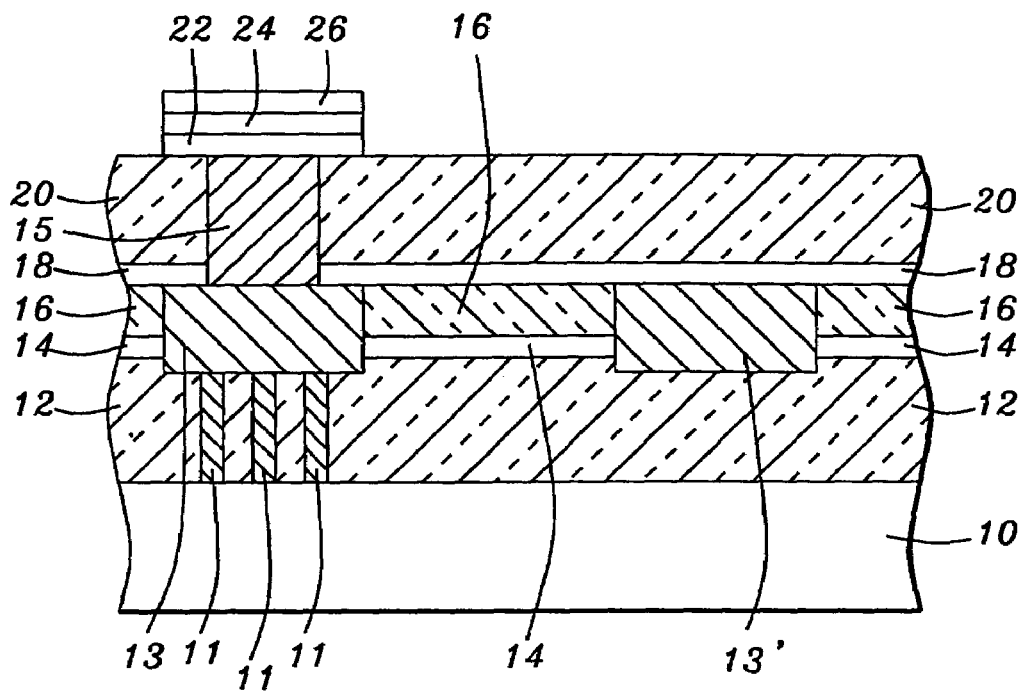
FIG. 3 is a cross-section after the three deposited layers have been patterned and etched, creating a metal capacitor.

Layers 22, 24 and 26 are then patterned and etched using conventional methods of photolithographic patterning and etching, creating the three overlying layers for a metal capacitor that have been shown in cross section in FIG. 3. After the cross section that has been shown in FIG. 3 has been completed, the invention continues with the deposition of a layer 28, shown in cross section in FIG. 4, of spacer material.

Spacers can be made using silicon-nitride or silicon-oxide, BSG, PSG, polysilicon, other materials preferably of a dielectric nature, CVD oxide formed from a TEOS source. Often used are amorphous materials that inhibit the deposition of epitaxial silicon thereupon.

The preferred material and of significant importance to the invention for the creation of layer 28 of spacer material is a non-leaky material.

Figure 4:
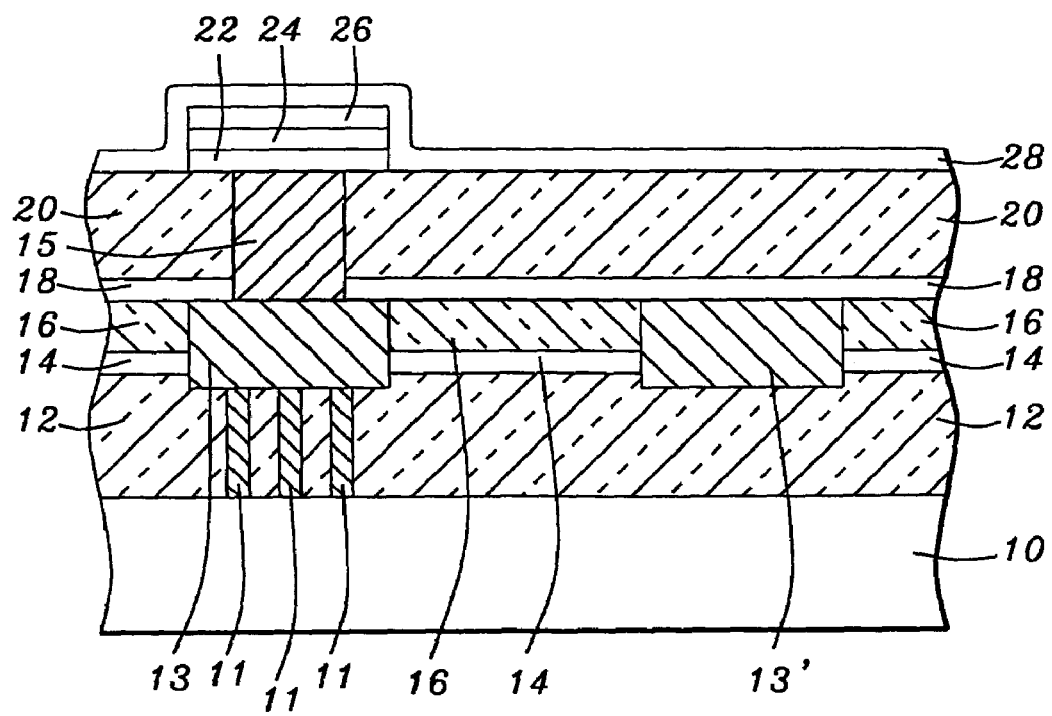
FIG. 4 is a cross-section after a layer of spacer material has been deposited.

Layer 28 preferably comprises PECVD silicon dioxide, deposited over the surface of the structure that is shown in cross section in FIG. 3 and resulting in the cross section that is shown in FIG. 4. The etching of the deposited layer 28 of spacer material results in the creation of spacers 28, FIG. 5, overlying sidewalls of the etched layers 22, 24 and 26 of the MIM capacitor.

Figure 5:
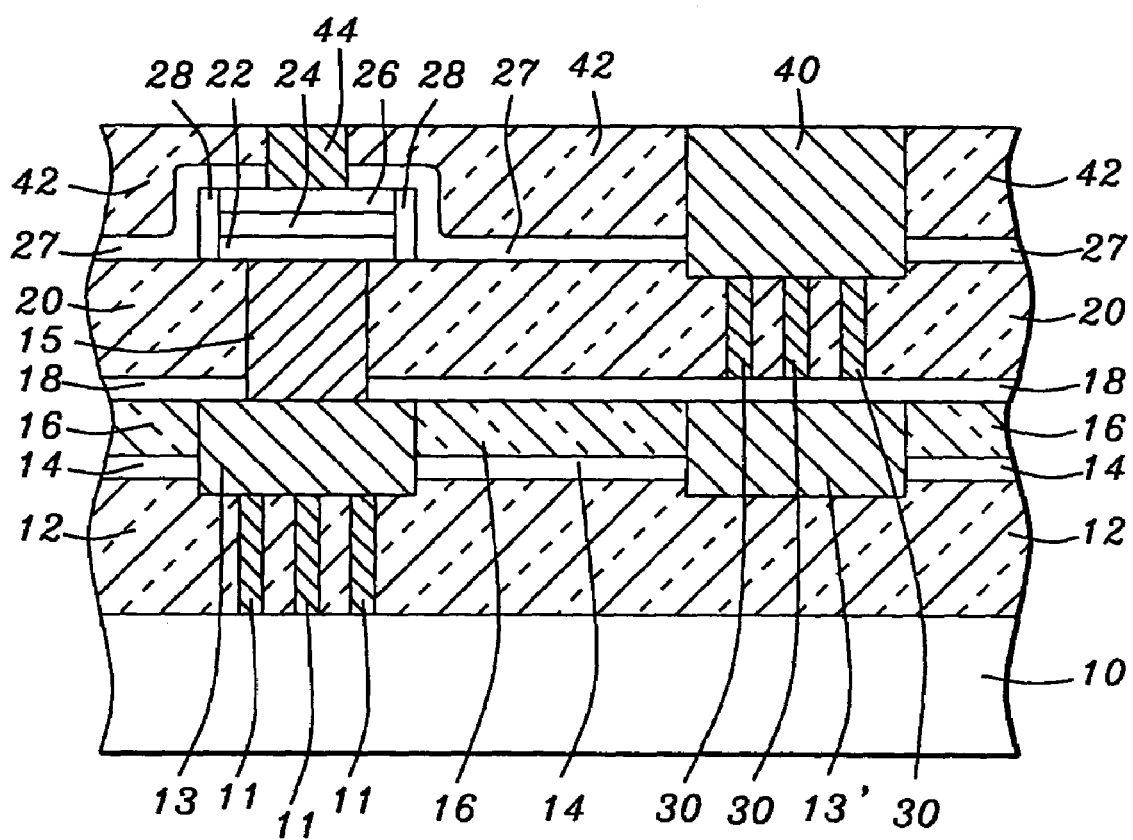
FIG. 5 is a cross-section after the deposited layer of spacer material has been etched, creating spacers over sidewalls of the MIM capacitor, a layer of etch stop material has been deposited, a second layer of interconnect metal has been created over the created metal capacitor and over the first layer of interconnect metal.

The special spacer design that is provided by the invention, shown as spacers 28 in the cross section of FIG. 5, is another key aspect of the invention.

After the formation of spacers 28, it is accepted practice to deposit a layer of etch stop material 27, FIG. 5, preferably comprising silicon nitride, over the surface of the layer 20 of dielectric, including over the surface of the spacers 28.

Figure 6:
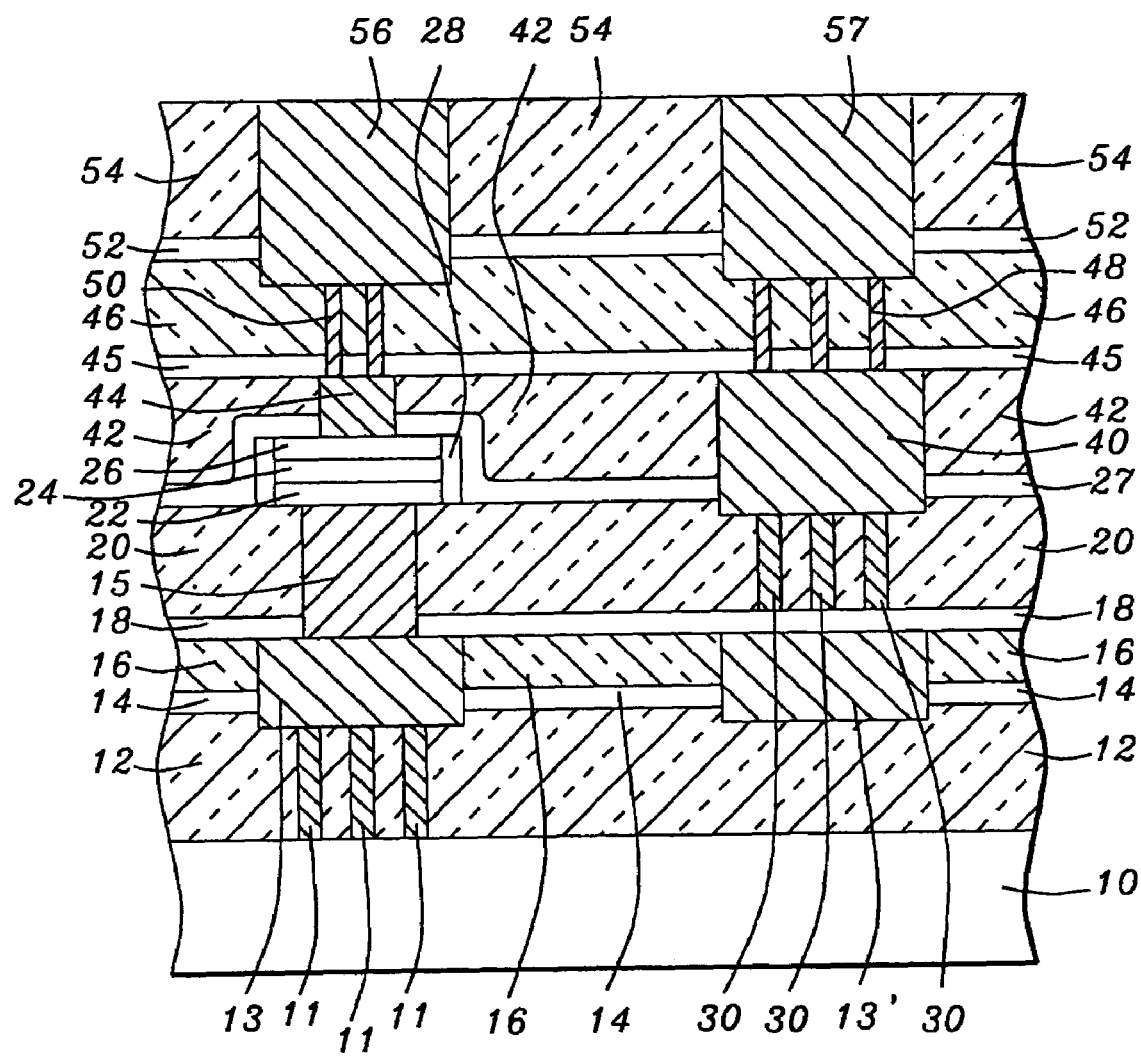
FIG. 6 is a cross-section after a third layer of interconnect metal has been created over the second layer of metal interconnect.

The invention then continues with the creation of overlying layers of interconnect metal as shown in the cross sections of FIGS. 5 and 6.

Specifically referring to the cross section that is shown in FIG. 5, a fourth layer 42 of dielectric is deposited over the surface of layer 27 of etch stop material. As a first step in the creation of overlying layers of interconnect metal the plugs 30 are created through layer 20 of dielectric, these plugs 30 serve to further interconnect metal plug 13' to overlying interconnect traces. Conventional methods of photolithographic exposure and etching are applied for this purpose, exposing and etching through layers 42, 27, 20 and 18 in accordance with a pattern of metal interconnects 30 and 40.

Multiple steps of exposure and etching are required for this purpose in view of the difference in the topography of the openings that are required for plugs 30 and for plug 40. The openings that have been created for plugs 30 and 40 are filled with metal, preferably comprising copper, excess metal is removed from the surface of layer 42 after which an opening for metal plug 44 is created through the layer 42 of dielectric. A layer of metal, preferably comprising copper, is then deposited over the surface of layer 42 of dielectric, removal of excess metal leaves in place a copper filling forming interconnect 44, which completes that creation of the structure that has been shown in cross section in FIG. 5.

It must again be emphasized that the layers of interconnect metal that have been shown in cross section in FIG. 5 are meant to represent examples of how interconnect metal can be created in conjunction with the creation of a metal capacitor.

This is further highlighted in the cross section of FIG. 6 where additionally have been indicated and highlighted the following layers of interconnect metal:

45, a third layer of etch stop material deposited over the surface of layer 42, including the surface of interconnects 40 and 44

46, a fifth layer of dielectric deposited over the surface of layer 45 of etch stop material

52, a fourth layer of etch stop material deposited over the surface of layer 46 of dielectric

54, a sixth layer of dielectric deposited over the surface of layer 52 of etch stop material

50, metal plugs created through layer 46 of dielectric aligned with the created metal capacitor comprising the layers 22, 24 and

48, metal plugs created through layer 46 of dielectric and layer 45 of etch stop material aligned with the created metal plug 40

56, a metal plug created through the layer 54 of dielectric and layer 52 of etch stop material, metal plug 56 is aligned with the metal capacitor comprising the layers 22, 24 and 26

57, a metal plug created through the layers 54 of dielectric and layer 52 of etch stop material, metal plug 56 is aligned with the metal plugs 48.

The term metal plug is used here interchangeably with the term metal interconnect.

This completes the structures that are shown by way of examples of layers of interconnect metal that can be created in combination with the creation of a metal capacitor whereby the metal capacitor is characterized by having:

1. A silicon dioxide film used as the dielectric layers for a metal capacitor; this enables the integration of creating a metal capacitor into conventional semiconductor processing
2. Lower capacitor leakage is accomplished by using PECVD silicon dioxide spacers
3. Improved performance of capacitance voltage linearity is achieved by using a copper diffusion barrier material comprising TaN, TiN or Ta for the bottom and top electrode of the MIM capacitor
4. A range of high-k dielectric materials can be used for the capacitor dielectric since the copper top and bottom electrodes are replaced with a copper diffusion barrier material comprising TaN, TiN or Ta, further enabling the integration of creating a metal capacitor into conventional semiconductor processing
5. A metal capacitor can be created as part of a copper metal interconnect scheme whereby the metal capacitor has low breakdown characteristics; conventional problems of the formation of copper hillocks and the therefrom following high capacitor leakage current have been eliminated, and
6. A metal capacitor with spacer material is created having low capacitor sidewall leakage current.

More specifically provided by the invention are:

Structure 13, FIG. 1–6, which functions as an interconnection to the bottom electrode of the MIM capacitor and which provides for protecting the surface of interconnect 13' during etching of the layers of MIM material Layers 22 and 26, the bottom and top electrode of the MIM capacitor, preferably comprise a copper diffusion barrier material comprising TaN, TiN or Ta, creating a symmetric sandwich structure of the MIM capacitor, which provides excellent voltage linearity of the MIM capacitor By using a copper diffusion barrier material comprising TaN, TiN or Ta for the bottom and top electrode of the MIM capacitor, the occurrence of copper hillocks is avoided, thereby reducing initial breakdown of the created MIM capacitor, which is conventionally experienced with the use of copper as a preferred material for the MIM capacitor plates Spacer 28 assures a significant distance between the created MIM capacitor and a thereover deposited etch stop layer, assuring low leakage current of the created MIM capacitor.

The invention, which provides for the creation of a metal capacitor, can be summarized as follows:

starting with a semiconductor substrate depositing a first layer of capacitor plate material over the substrate, the first layer of capacitor plate material comprising copper diffusion barrier material depositing a layer of capacitor dielectric material over the first layer of capacitor plate material depositing a second layer of capacitor plate material over the capacitor dielectric material, the second layer of capacitor plate material comprising copper diffusion barrier material patterning and etching the second layer of capacitor plate material, the layer of capacitor dielectric material and the first layer of capacitor plate material creating spacers over sidewalls of the capacitor the first and second layer of capacitor plate material is TaN, TiN or Ta the capacitor dielectric material having a dielectric-constant dielectric of at least 2.5 the high dielectric-constant dielectric material is oxide-nitride-oxide (ONO), silicon dioxide ($SiO_2$), silicon nitride ($Si_3N_4$) or tantalum pentoxide ($TaO_5$)

the spacers created over sidewalls of the capacitor comprising PECVD silicon dioxide.

Alternately, the invention, which provides for the creation of a metal capacitor, can be summarized as follows:

providing a substrate creating at least one first layer of patterned and etched interconnect first metal over the surface of the substrate, the at least one first layer of patterned and etched interconnect first metal comprising at least one point of electrical contact in the surface thereof creating at least one metal interconnect aligned with the at least one point of electrical contact provided in the surface of the at least one first layer of interconnect first metal creating at least one metal capacitor over the surface of the least one metal interconnect creating a layer of spacer material over sidewalls of the at least one metal capacitor, and creating at least one second layer of patterned and etched interconnect second metal over the surface of the layer of spacer material, the least one second layer of patterned and etched interconnect second metal contacting the at least one metal capacitor the first metal, second metal and the metal interconnect comprising copper the creating at least one metal interconnect comprising:
depositing a layer of etch stop material over the surface of the at least one first layer of interconnect first metal;
depositing a layer of dielectric over the surface of the layer of etch stop material;
patterning and etching the layers of dielectric and etch stop material, creating at least one opening there-through; and
filling the at least one opening with interconnect metal the creating at least one metal capacitor over the surface of the least one metal interconnect comprising:
depositing a layer of etch stop material over the at least one metal interconnect;
depositing a first layer of capacitor plate material over the surface of the layer of etch stop material;
depositing a layer of capacitor dielectric material over the surface of the first layer of capacitor plate material;
depositing a second layer of capacitor plate material over the surface of the layer of capacitive dielectric material; and
patterning and etching the first layer of capacitor plate material, the layer of capacitor dielectric material and the second layer of capacitor plate material.

the first and second layer of capacitor plate material is TaN, TiN or Ta the capacitor dielectric material having a dielectric-constant in excess of about 2.5 the spacer material is PECVD silicon dioxide.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A metal capacitor, comprising:
a first capacitor plate over a substrate;
a capacitor dielectric over the first capacitor plate; and
a second capacitor plate over the capacitor dielectric, and at least one of the first and the second capacitor plates comprising TaN, TiN or Ta; and
spacers over sidewalls of the first plate, the capacitor dielectric, and the second plate;
a conformal etch stop layer on the metal capacitor, such that the spacers are between the etch stop layer and the metal capacitor.

2. The capacitor of claim 1, wherein said capacitor dielectric comprises oxide-nitride-oxide (ONO), silicon dioxide ($SiO_2$), silicon nitride ($Si_3N_4$) or tantalum pentoxide ($TaO_5$).

3. The capacitor of claim 1, wherein the spacers over sidewalls of the capacitor comprise PECVD silicon dioxide.

4. The capacitor of claim 1, wherein the conformal etch stop layer comprises silicon nitride.

5. The capacitor of claim 1, further comprising:
a dielectric layer on the etch stop layer; and
a plug through the dielectric layer and the etch stop layer to electrically connect to the second capacitor plate.

6. A capacitor over a substrate, comprising:
at least one first patterned interconnect metal over a substrate, comprising at least one point of electrical contact in the surface thereof;
at least one metal interconnect aligned with the point of electrical contact;
at least one metal capacitor over the metal interconnect, comprising a first capacitor plate, a capacitor dielectric and a second capacitor plate, wherein at least one of the first and second capacitor plate comprises TaN, TiN or Ta
spacers over sidewalls of the metal capacitor, wherein the spacers do not cover a top portion of said metal capacitor; and
a conformal etch stop layer over the metal capacitor, wherein the spacers are located between the etch stop layer and the sidewalls of the metal capacitor.

7. The capacitor of claim 6, further comprising
at least one second patterned interconnect metal over the spacers, contacting the metal capacitor.

8. The capacitor of claim 6, wherein the etch stop layer comprises silicon nitride.

9. The capacitor of claim 6, wherein the second patterned interconnect metal comprises copper.

10. The capacitor of claim 6, wherein the first patterned interconnect metal comprises copper.

11. The capacitor of claim 6, wherein the metal interconnect comprises copper.

12. The capacitor of claim 6, wherein the capacitor dielectric comprises oxide-nitride-oxide (ONO), silicon dioxide ($SiO_2$), silicon nitride ($Si_3N_4$) or tantalum pentoxide ($TaO_5$).

13. The capacitor of claim 6, wherein the spacers comprise PECVD silicon dioxide.

14. A semiconductor device, comprising; a stack of first and second dielectric layers over a substrate; a metal capacitor disposed in the second dielectric layer over the first dielectric layer, comprising: a first capacitor plate; a capacitor dielectric over the first capacitor plate; and a second capacitor plate over the capacitor dielectric, and at least one of the first and the second capacitor plates comprising TaN, TiN or Ta; spacers over sidewalls of the first plate, the capacitor dielectric, and the second plate; a conformal etch stop layer on the metal capacitor, such that the spacers are between the etch stop layer and the metal capacitor; and at least one patterned interconnect metal disposed in the stack of first and second dielectric layers and formed in integrity.

* * * * *